(12) United States Patent
Liu et al.

(10) Patent No.: US 8,426,953 B2
(45) Date of Patent: Apr. 23, 2013

(54) SEMICONDUCTOR PACKAGE WITH AN EMBEDDED PRINTED CIRCUIT BOARD AND STACKED DIE

(75) Inventors: Yong Liu, Scarborough, ME (US); Margie T. Rios, Mandaue (PH); Hua Yang, Suzhou (CN); Yumin Liu, Suzhou (CN); Tiburcio A. Maldo, Suzhou (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 13/227,802

(22) Filed: Sep. 8, 2011

(65) Prior Publication Data

US 2012/0001313 A1 Jan. 5, 2012

Related U.S. Application Data

(62) Division of application No. 11/970,087, filed on Jan. 7, 2008, now Pat. No. 8,030,743.

(51) Int. Cl.
 *H01L 23/495* (2006.01)
(52) U.S. Cl.
 USPC ........... 257/676; 257/672; 257/673; 257/686; 257/E21.511; 257/E23.042; 438/107; 438/123
(58) Field of Classification Search .................. 257/672, 257/673, 686, 676, E21.511, E23.042; 438/107, 438/123
See application file for complete search history.

(56) References Cited

U.S. PATENT DOCUMENTS

| | | | |
|---|---|---|---|
| 5,708,280 A | 1/1998 | Lebby et al. | |
| 5,736,785 A | 4/1998 | Chiang et al. | |
| 6,798,049 B1 | 9/2004 | Shin et al. | |
| 7,176,506 B2 | 2/2007 | Beroz et al. | |
| 2002/0180010 A1* | 12/2002 | Tsubosaki et al. | 257/667 |
| 2008/0122113 A1* | 5/2008 | Corisis et al. | 257/777 |

OTHER PUBLICATIONS

Zhenxian Liang, J.D. van Wyk and Fred C. Lee, "Embedded Power: A 3-D MCM Integration Technology for IPEM Packaging Application," IEEE Advanced packaging, vol. 29, No. 3, pp. 504-512, 2006.
Fairchild Semiconductor Corporation Data Sheet for FDMC2380 Dual Integrated Solenoid Driver, Aug. 2007, pp. 1-15.

* cited by examiner

*Primary Examiner* — Julio J Maldonado
*Assistant Examiner* — Hajar Kolahdouzan
(74) *Attorney, Agent, or Firm* — Hiscock & Barclay, LLP

(57) ABSTRACT

A two tier power module has, in one form thereof, a PC board having upper and lower traces with an opening in the insulating material that contains a power device which has upward extending solder bump connections. An upper leadframe is mounted on the solder bumps and the upper tracks of the PC board. Vias in the PC board connect selected upper and lower traces. A control device is mounted atop the leadframe and wire bonded to the leadframe, and the assembly is encapsulated leaving exposed the bottom surfaces of the lower traces of the PC board as external connections. In another form the PC board is replaced by a planar leadframe and the upper leadframe has stepped sections which make connections with the planar leadframe, the bottom surfaces of the planar leadframe forming external connections of the module.

10 Claims, 21 Drawing Sheets

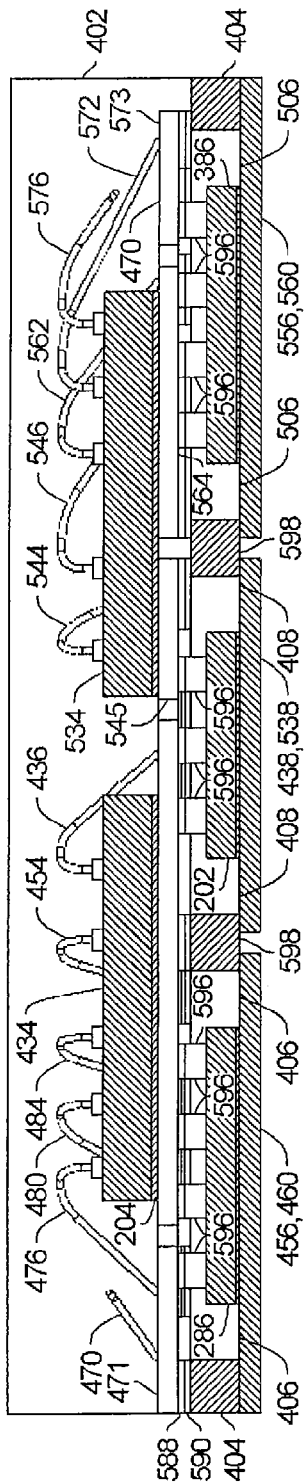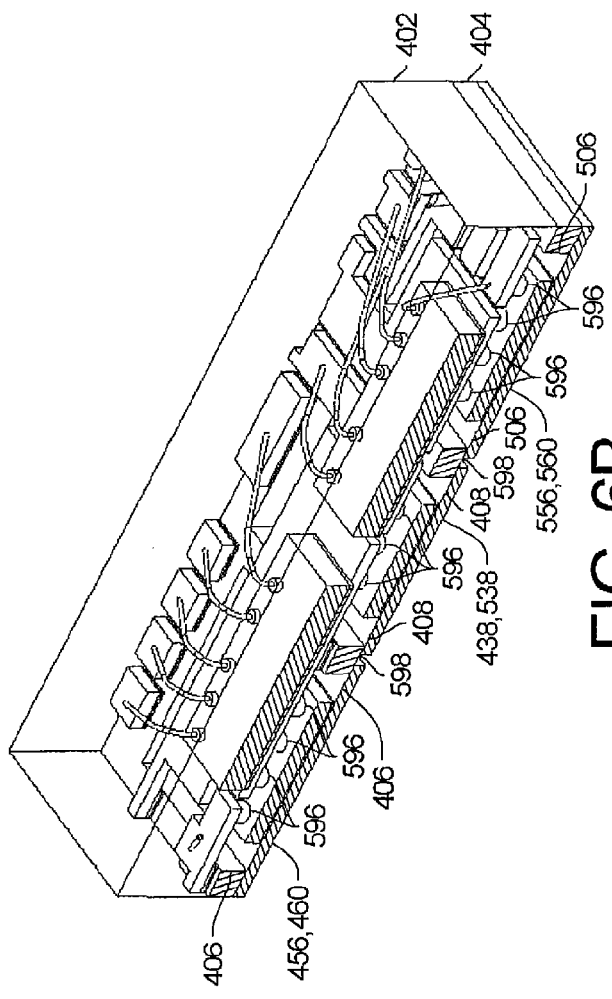

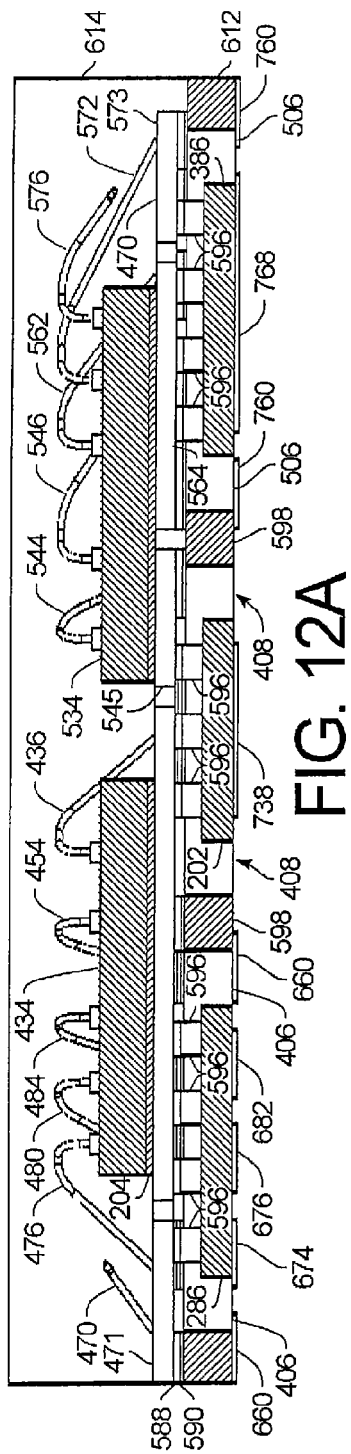
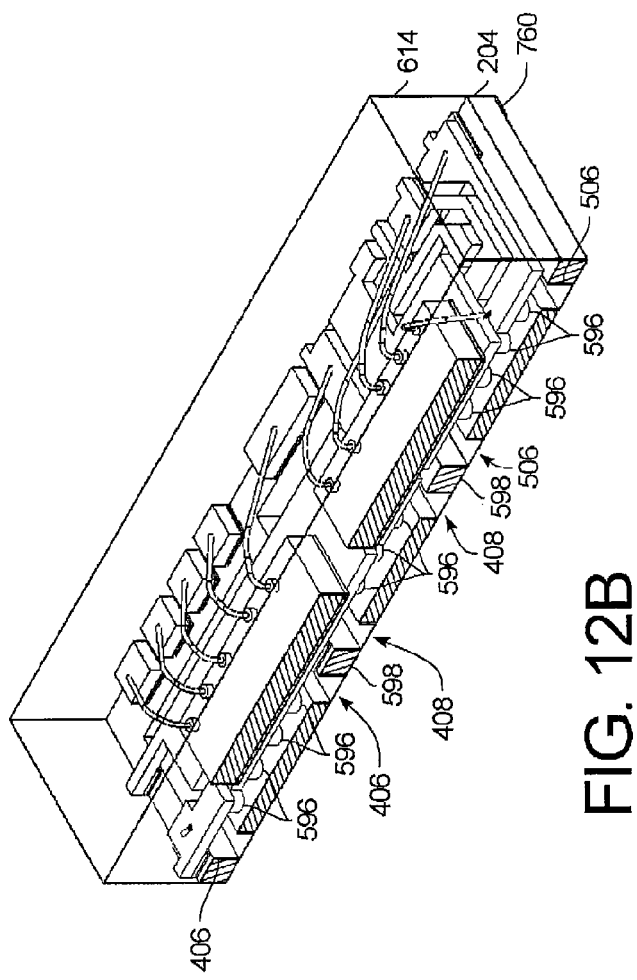
FIG. 12A
FIG. 12B

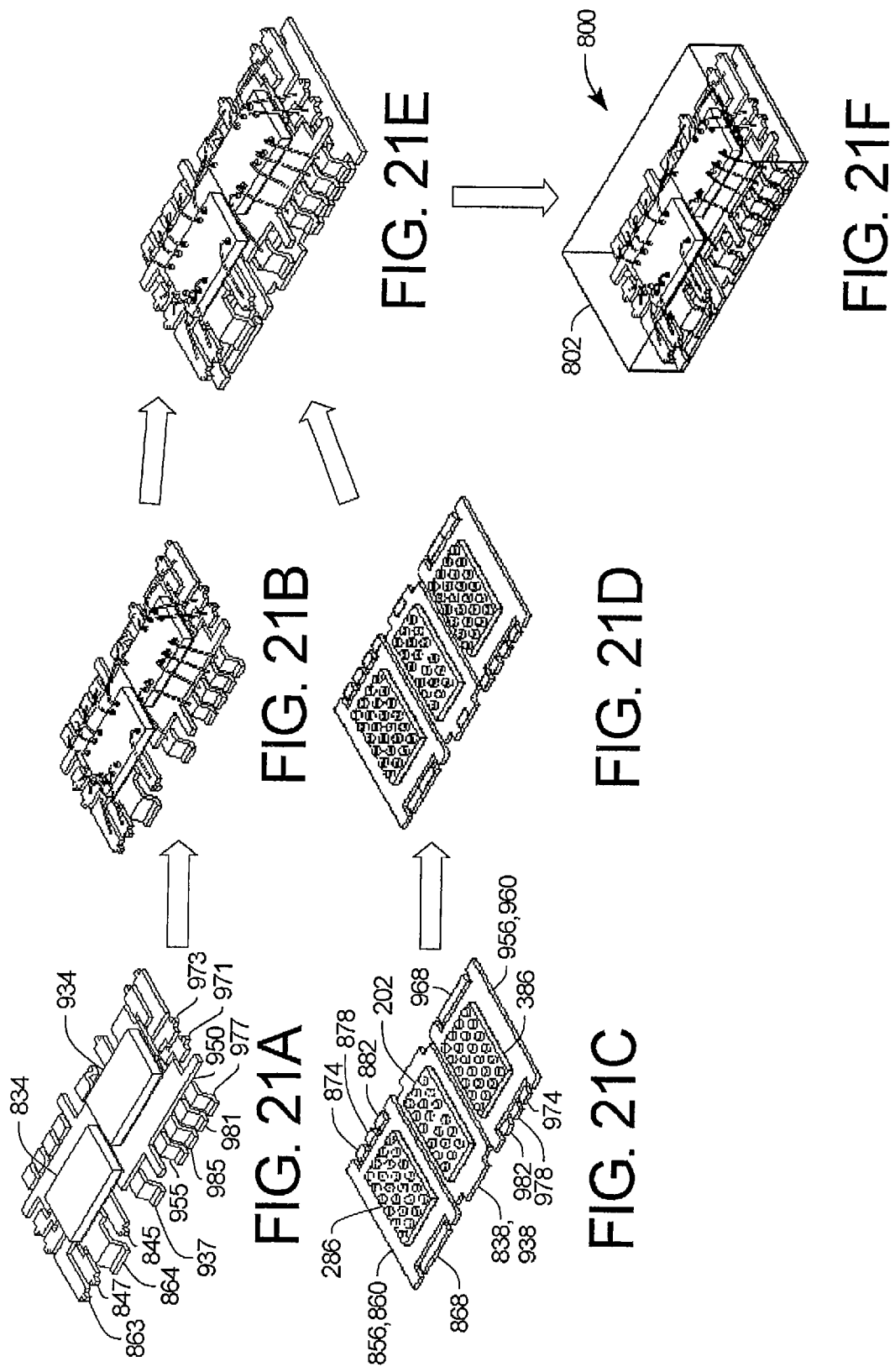

SEMICONDUCTOR PACKAGE WITH AN EMBEDDED PRINTED CIRCUIT BOARD AND STACKED DIE

CROSS-REFERENCE TO RELATED APPLICATION

This is a divisional application of U.S. patent application Ser. No. 11/970,087 filed Jan. 7, 2008, the specification of which is hereby incorporated in its entirety.

FIELD OF THE INVENTION

This invention relates semiconductor packages, and more particularly, to semiconductor packages with multiple die and embedded lead printed circuit boards.

BACKGROUND OF THE INVENTION

Semiconductor packages with multiple die (sometimes referred to as hybrid semiconductor devices) provide improved connections between die in the package compared to conventional packaged die which are generally mounted on a printed circuit board, and also reduce the amount of space required on a printed circuit board (PCB) due to the denser concentration of multiple die. A wide variety of such packages are known in the art, and there is a constant need to improve the interconnections between the multiple chips in a package and to increase the number of die to lessen the size of the PCB due to the combination of otherwise individually packaged die within a single package.

Therefore, it can be appreciated that semiconductor package which holds multiple die in a relatively small package compared to common prior art multiple die packages of comparable electrical functionality is desirable.

SUMMARY OF THE INVENTION

The invention comprises, in one form thereof, a semiconductor package with an insulator having a first plurality of conductive regions attached to a first side thereof, and a second plurality of conductive regions attached to an opposite side thereof with at least one electrical connection extending through the insulator to connect at least one of the first plurality of conductive regions on the first side and at least one of the second plurality of conductive regions on the opposite side, the insulator having at least one cavity with an opening extending between the opposite sides, at least one die located in the at least one cavity and having a third plurality of solder bumps on a first side thereof, a leadframe having a fourth plurality of conductive traces, at least one of the fourth plurality of conductive traces being attached to at least one of the third plurality of the solder bumps to a first side thereof, and at least another of the conductive traces connected to at least one of the second plurality of conductive regions, as least another die bonded to a second side of the leadframe opposite the first side, a fifth plurality of wire bonds connecting the at least another die with the leadframe, and encapsulating material molded to at least a portion of the insulator, to the at least one die, to the leadframe, to the at least another die, and to the fifth plurality of wire bonds, with the first plurality of conductive regions forming external electrical terminals of the semiconductor package The invention comprises, in another form thereof, a semiconductor package which includes a planar leadframe having a first side and an opposite second side, the planar leadframe having a first plurality of conductive traces, at least one die having a first side bonded to the first side of at least one of the first plurality of conductive traces on the planar leadframe, the at least one die having a second side comprising a second plurality of solder bumps, another leadframe having a third plurality of conductive traces, at least one of the third plurality of conductive traces being attached to the at least one die on the second side thereof, and another of the third plurality of conductive traces attached to at least one of the first side of at least one of the first plurality of conductive traces on the planar leadframe, as least another die bonded to, and electrically insulated from, the another leadframe, a third plurality of wire bonds connecting the at least another die with the another leadframe, and encapsulating material molded to at least a portion of the planar leadframe, to the at least one die, to the another leadframe, to the another die, and to the third plurality of wire bonds, with at least a fourth plurality of conductive traces on the second side of the planar leadframe being external electrical terminals of the semiconductor package.

In yet another form, the invention includes a method of producing an encapsulated power module comprising the steps of providing an insulator having a first plurality of conductive regions attached to a first side thereof with an opening through the insulator exposing at least one of the first plurality of conductive regions, placing a power semiconductor device in the opening and die bonding the power semiconductor device to the at least one of the first plurality of conductive regions, the power semiconductor device having a second plurality of solder bump connections on a side of the power semiconductor device opposite a side of the power semiconductor device die bonded to the at least one of the first plurality of conductive regions, attaching a first side of a leadframe to the solder bump connections and to a third plurality of conductive regions on a second side of the insulator, the insulator containing vias between selected ones of the first and third pluralities of conductive regions die bonding another device to the leadframe on a side of the leadframe opposite the first side, wire bonding the another device to the leadframe, and encapsulating the insulator, the power semiconductor device, the leadframe, the another device, and the wire bonds wherein the bottom surfaces of the first plurality of conductive regions form external connections to the encapsulated power module.

In still another form, the invention includes a method of producing an encapsulated power module including the steps of providing an insulator having a first plurality of conductive regions attached to a first side thereof and a second plurality of conductive regions to a second, opposite side thereof, with an opening in the insulator and the first and second pluralities of conductive regions attaching a first side of a leadframe to a third plurality of solder bump connections on a power semiconductor device and to the second plurality of conductive regions such that the power semiconductor device lies in the opening die bonding another device to a second side of the leadframe opposite to the first side, wire bonding the another device to the leadframe; and encapsulating the insulator, the power semiconductor device, the leadframe, the another device, and the wire bonds wherein the bottom surfaces of the first plurality of conductive regions form external connections to the encapsulated power module.

In an additional form, the invention includes a method of producing an encapsulated power module comprising the steps of die bonding a power semiconductor device to a first side of a planar leadframe, die bonding another device to a first side of another leadframe, wirebonding the another device to the another leadframe, attaching solder bump connections of the power semiconductor device on a second side of the power semiconductor device and the planar leadframe to a second side of the another leadframe opposite the first side of the another leadframe, and encapsulating the second side of the planar leadframe, the power semiconductor device, the another leadframe, the another device, and the wirebonds wherein the second side of the planar leadframe forms external connections to the encapsulated power module.

BRIEF DESCRIPTION OF THE DRAWINGS

The aforementioned and other features, characteristics, advantages, and the invention in general will be better understood from the following more detailed description taken in conjunction with the accompanying drawings, in which:

FIG. 6A is a side cross sectional view of the package shown in FIG. 5 taken along the line 6A, 6B;

FIG. 6B is a top isometric cross sectional view of the package shown in FIG. 5 taken along the line 6A, 6B;

FIG. 12A is a side cross sectional view of the package shown in FIG. 11 taken along the line 12A, 12B;

FIG. 12B is a top isometric cross sectional view of the package shown in FIG. 11 taken along the line 12A, 12B;

FIGS. 21A-21F are process flow diagrams showing the fabrication steps in forming the package shown in FIG. 17.

Figure 1:
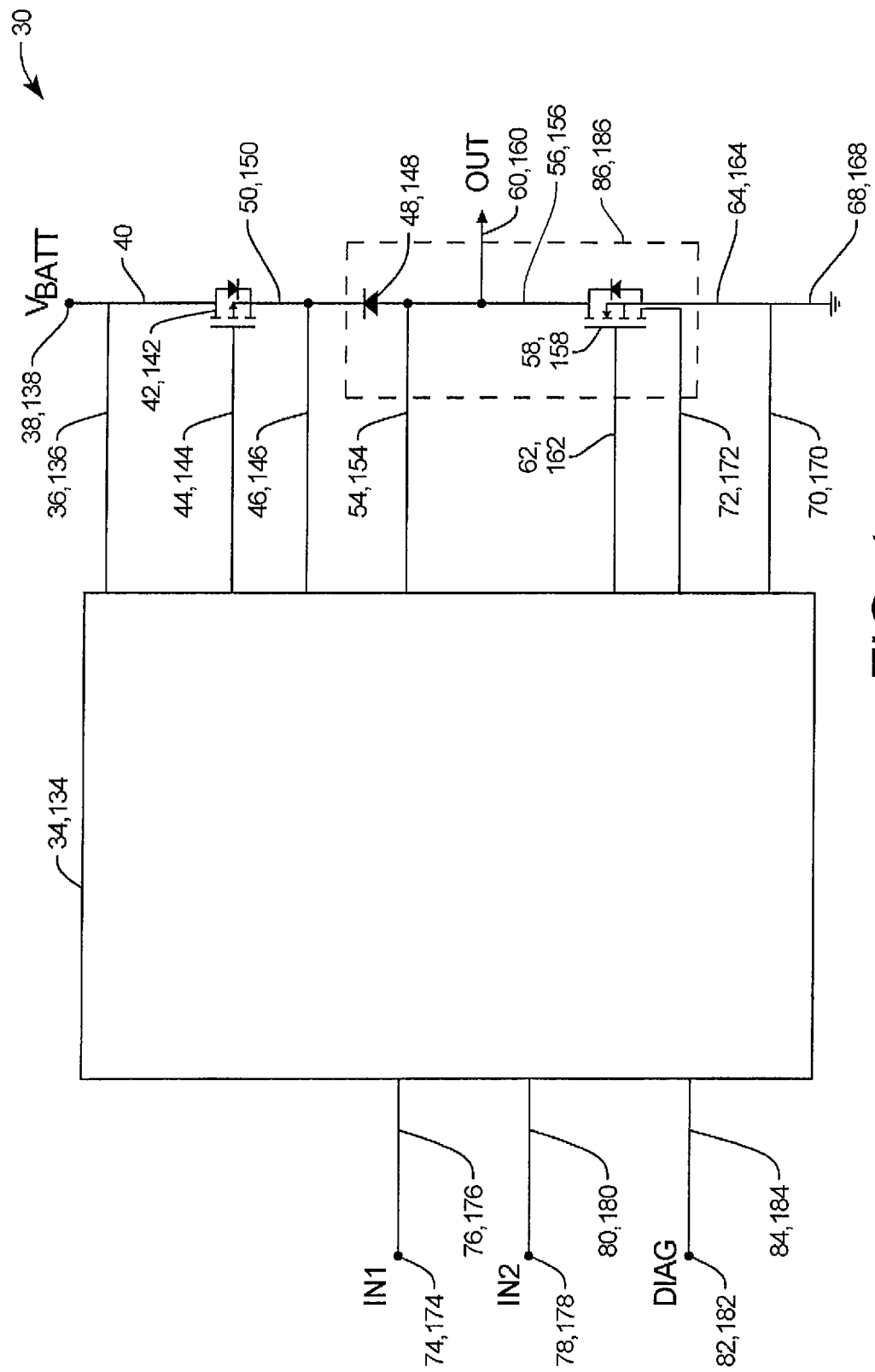
FIG. 1 is a schematic drawing of a control circuit, two of which are packaged together in three embodiments of the present invention.

It will be appreciated that for purposes of clarity and where deemed appropriate, reference numerals have been repeated in the figures to indicate corresponding features. Also, the relative size of various objects in the drawings has in some cases been distorted to more clearly show the invention.

DETAILED DESCRIPTION

Figure 2:
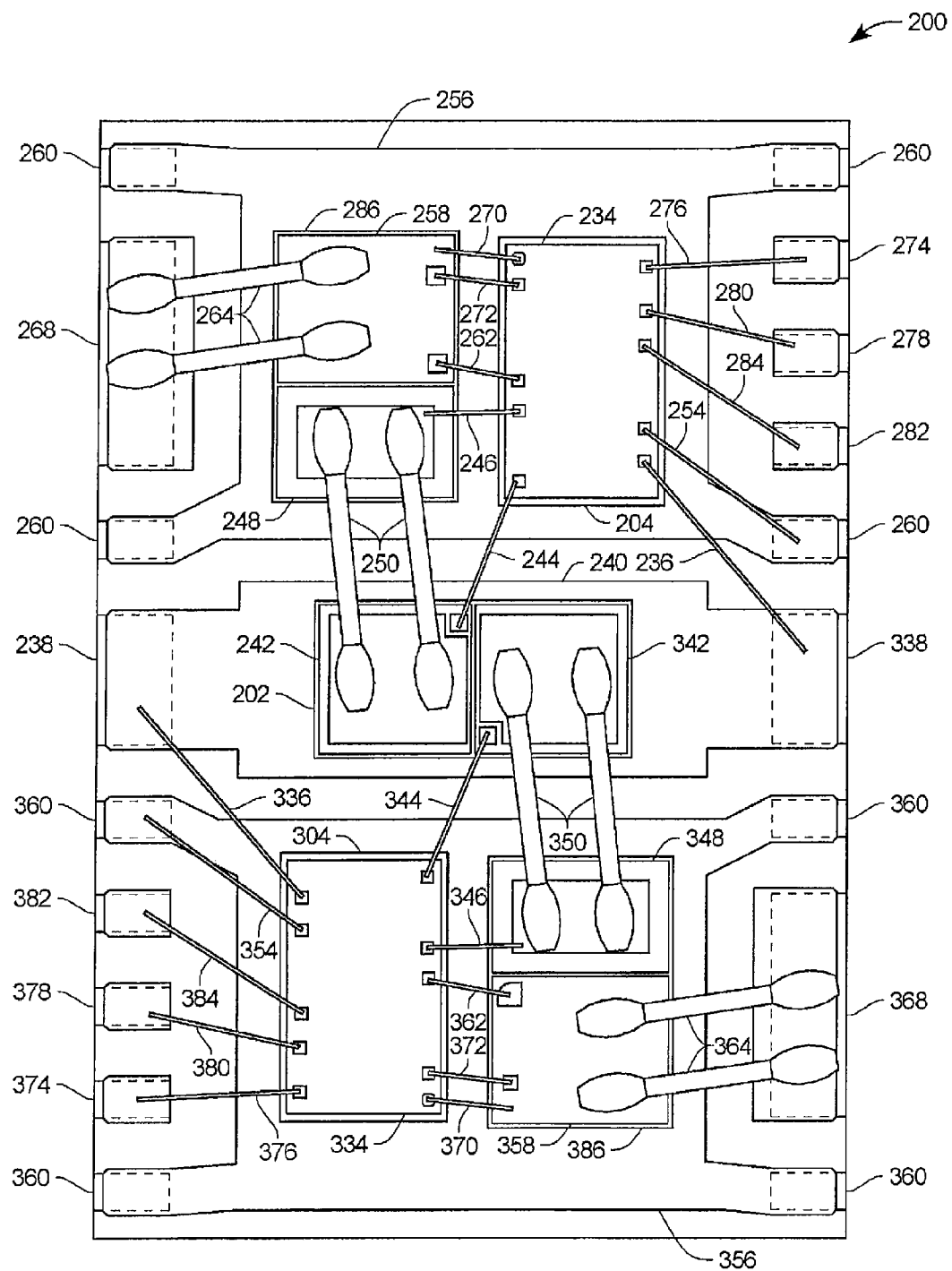
FIG. 2 is a top view of an encapsulated package used to hold and interconnect the components shown in FIG. 1 with the encapsulating material shown in outline.
Figure 3:
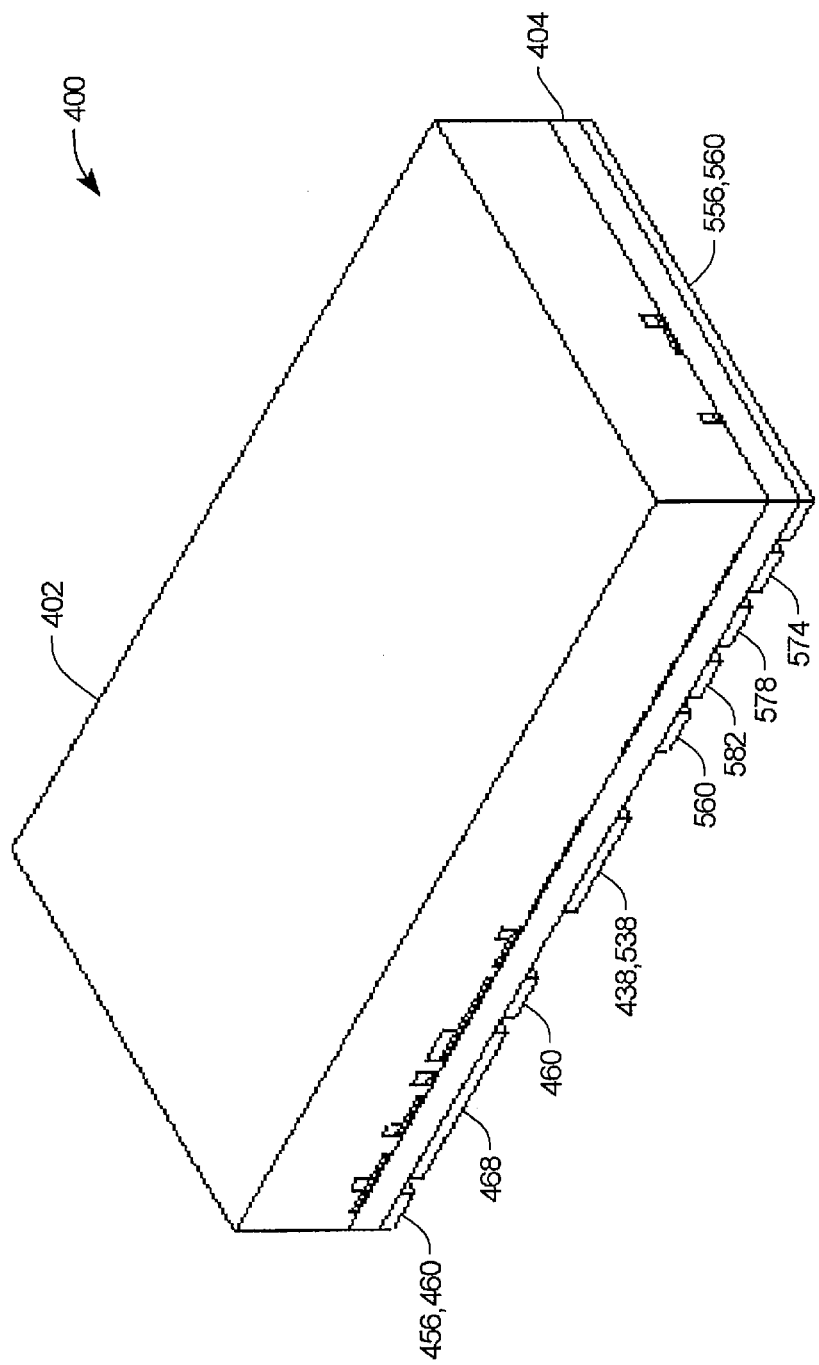
FIGS. 3 and 4 are respective top and bottom isometric views of a semiconductor package with an embedded PCB and stacked die according to one embodiment of the present invention.

FIG. 1 is a schematic diagram of an integrated solenoid driver 30, two of which are contained in a semiconductor package with an embedded PCB and stacked die 32 shown in FIG. 3. For reasons which will become clear in the description of package shown in FIG. 2 below, some of the elements in FIG. 1 have a single reference number, some of the elements have two reference numbers, and some have four reference numbers. The solenoid driver 30 has control and sensing circuitry which are embodied in an integrated control circuit 34, 134, one for each of the dual integrated solenoid driver 30 in the package 32. The control circuit 34, 134 receives a positive supply voltage, shown as VBATT in FIG. 1 on connection 36, 136, with the VBATT connected at terminates 38, 138 of the solenoid driver 30. The common node of the VBATT terminal 38, 138 and the connection 36, 136 has a connection 40, 140 to the source of a p channel MOSFET 42, 142. The gate of the p channel MOSFET 42, 142 has a connection 44, 144 to the control circuit 34, 134. The emitter of the p channel MOSFET 42, 142 has a connection 46, 146 to the control circuit 34, 134, and is connected to the cathode of a diode 48, 148 on a connection 50, 150, 52, 152. The anode of the diode 48, 148 has a connection 54, 154 to the control circuit 34, 134, a connection 56, 156 to an output terminal 60, 160 and to the emitter of an n channel MOSFET 58, 158. The gate of the n channel MOSFET 58, 158 has a connection 62, 162 to the control circuit 34, 134. The source of the n channel transistor 58, 158 has a connection 64, 164, 68, 168 to ground at a ground terminal 68, 168. The control circuit 34, 134 also has a connection 70,170 to the ground terminal 68, 168. The MOSFET 58,158 has another connection 72,172 to the control circuit 34,134 which is a signal from the MOSFET 58,158 indicating the current through the MOSFET 58,158.

The control circuit 34, 134 has three data terminals, a first control terminal 74, 174, labeled IN1, on a connection 76, 176, a second control terminal 78, 178, labeled IN2, on a connection 80, 180, and an output terminal 82, 182, labeled DIAG, on a connection 84, 184.

In the package embodiments of the circuit shown in FIG. 1 the diodes 48,148 and the MOSFETs 58,158 are formed together as single integrated circuits as indicated by the dashed box 86,186 in FIG. 1.

FIG. 2 is a top view of a power quad flat no-lead (PQFN) package 200 for the circuit 30 shown in FIG. 1. In FIG. 2 the components and connections which correspond to the components and connections in FIG. 1 have reference numbers which are the same reference numbers shown in FIG. 1 increased by 200. Thus, the MOSFET 42,142 in FIG. 1 corresponds to the MOSFETs 242 and 342 shown in FIG. 2, and the connection 36,136 in FIG. 1 corresponds to the wire bond connections 236 and 336 shown in FIG. 2. A complete list is shown at the end of this specification.

In FIG. 2 the battery terminals 238 and 338 are connected together by a leadframe segment 240 to which the MOSFETS 242 and 342, which are vertical MOSFETs, are die bonded. The MOSFETs 242,342 are formed on a single semiconductor die 202. The MOSFET 242 is part of the first of the two driver circuits in the package 200, the remaining devices, the diode 248, the MOSFET 258, and the control circuit 234 are die bonded to another leadframe segment 256 which is connected to the output terminals 260. Similarly, the MOSFET 342 is part of the second of the two driver circuits in the package 200, the remaining devices, the diode 348, the MOS- FET 358, and the control circuit 334 are die bonded to another leadframe segment 356 which is connected to the output terminals 360. The diodes 248, 348 and the MOSFETs 258, 358 are formed on single semiconductor dies 286 and 386, respectively. The control circuits 234 and 334 are electrically insulated from the leadframe sections 256 and 356, respectively, by respective wafer backside lamination tape 204 and 304.

The external leads or lands 260, 268, 274, 278, and 282 in the PQFN package are integral with the leadframe section 256. Similarly, the external leads or lands 238 and 338 are integral with the leadframe section 240, and the external leads 360, 382, 378, 374, and 368 are integral with leadframe section 356.

FIG. 3 is an top isometric view of a PQFN package 400 according to a first embodiment of the present invention. The package 400 includes molded encapsulating material 402, and a polymer outer frame such as a printed circuit board 404. The printed circuit board 404 is a double layer board with traces on the bottom that form the external leads of the package 400 and traces on the top of the board as shown in FIGS. 5-8G.

Figure 4:
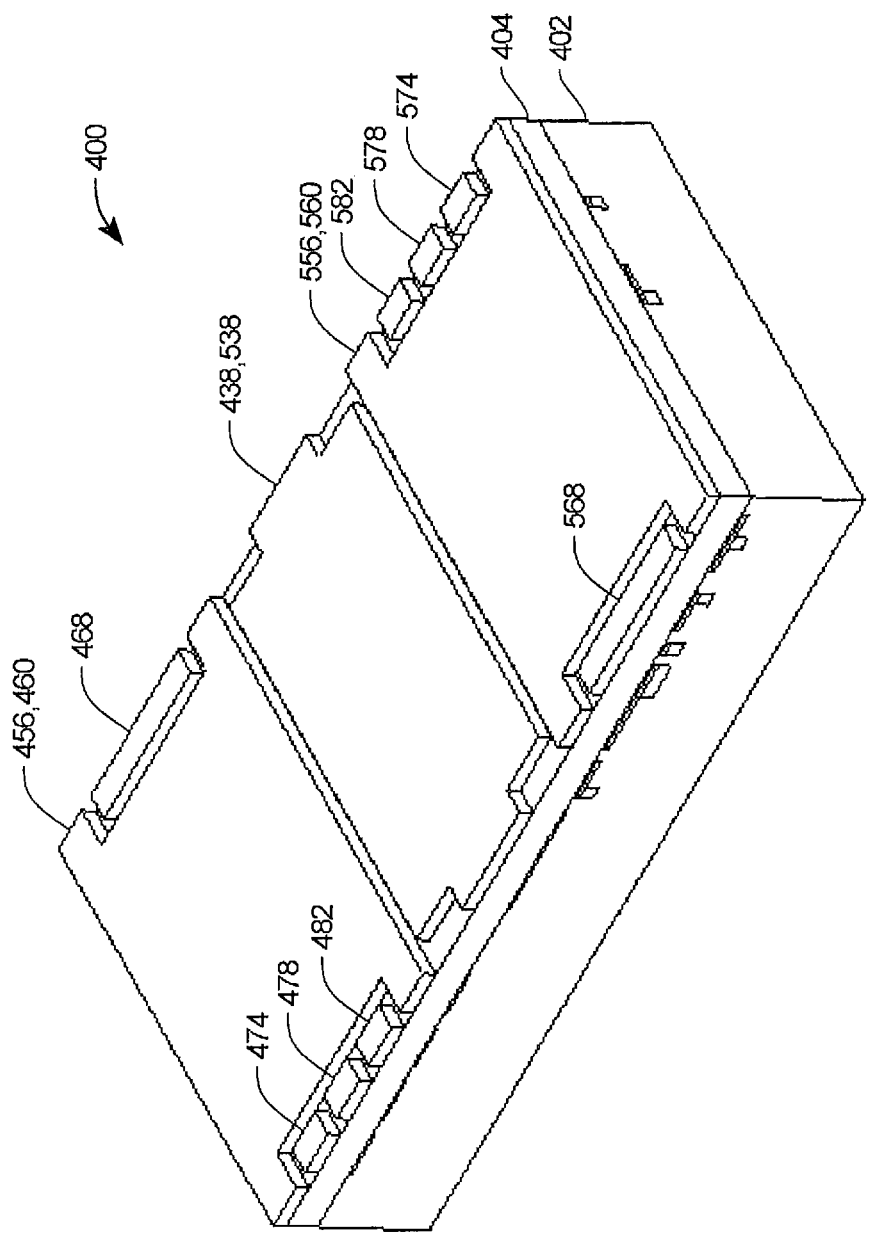

FIG. 4 is a bottom isometric view of the package 400 shown in FIG. 3. As can be seen in FIG. 4 the bottom traces of the PC board 404 have been patterned and external leads common to both sides of the package, leads 456,460, 438, 538, and 556,560, extend across the width of the package and provide heat sink plates for the power devices 42,142, 48,148, and 58,158 in FIG. 1, and can be attached to external heat sinks.

With reference now to FIGS. 5-8, the structure of the package 400 includes the printed circuit board 404 with the three polymer sections removed to create three cavities 406, 408, and 506 (best seen in FIG. 7) where the semiconductor dies 286, 202, and 386 are die bonded to the lower traces 456,460, 438,538, and 556,660, respectively. Two partitions 598 separate the cavities 406 and 408, and cavities 408 and 506. The PC board 404 has upper traces 588 with thermal vias 592 in the PC board 404 connecting the lower traces with selected upper traces.

A leadframe 606 (identified in FIG. 7) is soldered to the upper traces 588 and the solder bumps 596 (identified in FIGS. 6A and 6B) of the semiconductor dies 286, 202, and 386 using solder paste 590. In one form of this first embodiment the bottom traces of the PC board 404 are the same thickness as the leadframe 606. The control circuit dies 434 and 534 are attached to the top leadframe 606 using wafer backside lamination tape 204 and 304, respectively. Wire bonds 604 connect the wire bond pads (not shown) on the control circuit dies 343,534 to selected segments of the leadframe 606. Specifically wire bonds 436, 444, 446, 454, 462, 470, 472, 476, 480, and 484 connect the control circuit die 434 with leadframe segments 437, 445, 447, 455, 463, 471, 473, 477, 481, and 485, respectively. Similarly, wire bonds 536, 544, 546, 554, 562, 570, 572, 576, 580, and 584 connect the control circuit 534 die with leadframe segments 537, 545, 547, 555, 563, 571, 573, 577, 581, and 585, respectively.

Leadframe segments 450 and 550 connect the source of the transistors 42,142 to the cathodes of the diodes 48,148. The semiconductor dies 286,386 connect the leadframe segments 450,550 to the leadframe segments 447,547, respectively. The semiconductor dies 286,386 also connect the leadframe segments 464,564 to the leadframe segments 471,571, respectively. After the wire bonds have been formed, the package is encapsulated with the encapsulating material 402.

FIGS. 8A-8G illustrate the assembly process for forming the package 400. The three power semiconductor dies 286, 202,386 in FIG. 8A are soft soldered in the recesses 406,408, 506, respectively, to the bottom traces of the PC board 404 shown in FIG. 8B. The resulting partial assembly shown in FIG. 8C is flipped over and the leadframe 606 and the solder paste 590 positioned on the leadframe 606 as shown in FIG. 8D is soldered to the assembly shown in FIG. 8C to form the second subassembly shown in FIG. 8E. This second subassembly is flipped over and the control circuit dies 434,534 are attached to the top of the leadframe 606 using the wafer backside lamination tape 204 and 304 to form the third subassembly shown in FIG. 8F. The wire bonds 604 are formed as shown in FIG. 8G. The encapsulating material 402 is molded onto the assembly of FIG. 8G to form the final package 400 shown in FIGS. 3-6B.

Figure 9:
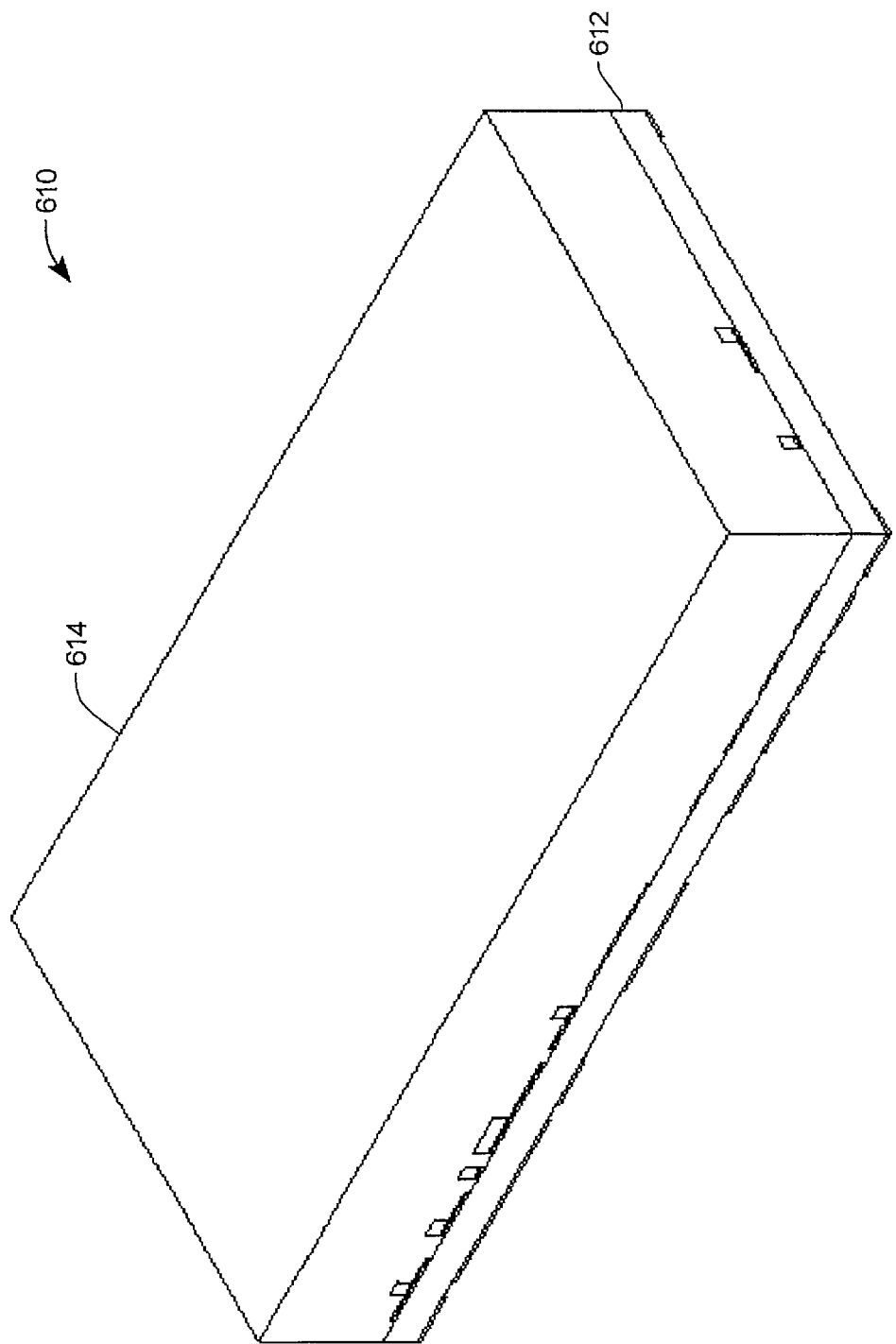
FIGS. 9 and 10 are respective top and bottom perspective views of a semiconductor package with an embedded PCB and stacked die according to a second embodiment of the present invention.

FIG. 9 is an top isometric view of a PQFN package 610 according to a second embodiment of the present invention. The package 610 includes molded encapsulating material 614, and a polymer outer frame such as a printed circuit board 612. The printed circuit board 612 is a double layer board with traces on the bottom that form the external leads of the package 610 and traces on the top of the board as shown in FIGS. 11-14G.

Figure 10:
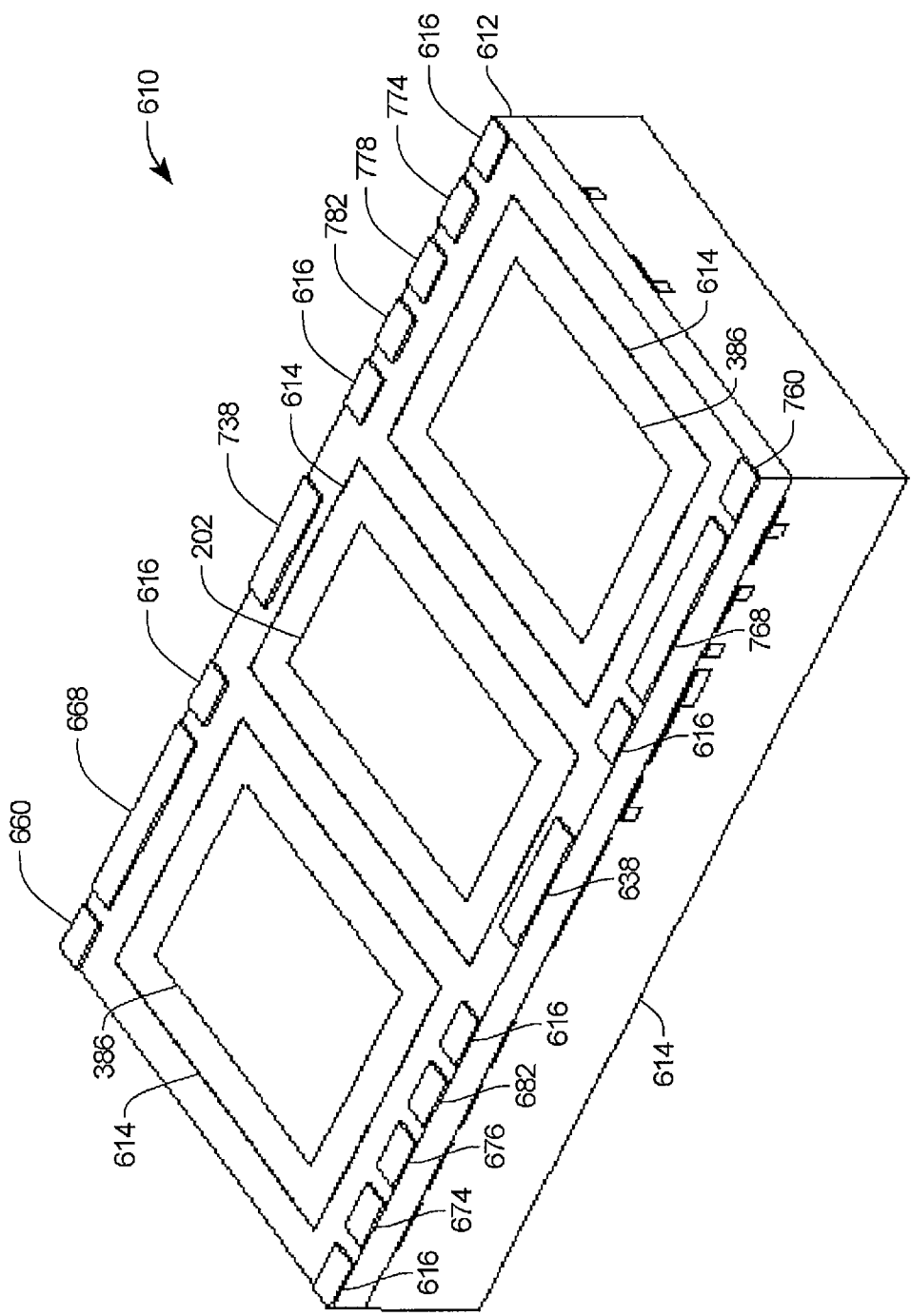

FIG. 10 is a bottom isometric view of the package 610 shown in FIG. 9. In this second embodiment the substrates (bottoms) of the semiconductor chips 286, 202, 386 are in the same plane as the bottom surface of the polymer of the PC board 612, with encapsulating material 614 filling the gap between the semiconductor chips 286, 202, 386 and the sides and the center partitions 598 of the PC board 612. Thus, the substrates of the semiconductor chips 286, 202, 386 do not have a connections with any other conductors inside the package 610. Since the substrates of the semiconductor chips 286, 202, 386 would need electrical connections when the package 610 is installed, and these connections would provide heat sinks for the semiconductor chips 286, 202, 386. There are also six trace segments 616 which have no connections with any other conductors inside the package 610, although they provide additional mechanical support for the package 610.

Figure 5:
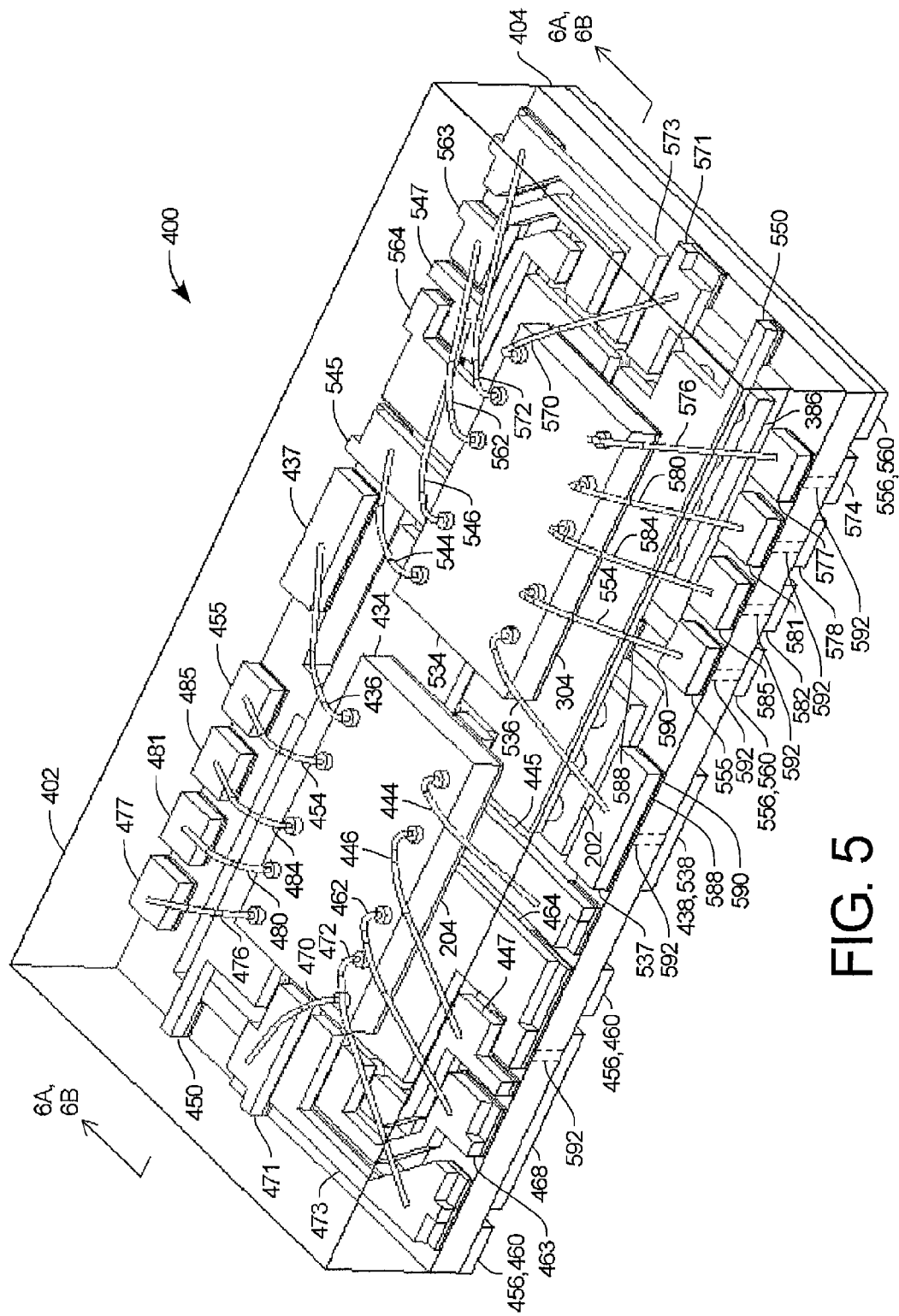
FIG. 5 is a top isometric view of the package shown in FIG. 3 with the encapsulating material shown in outline.
Figure 7:
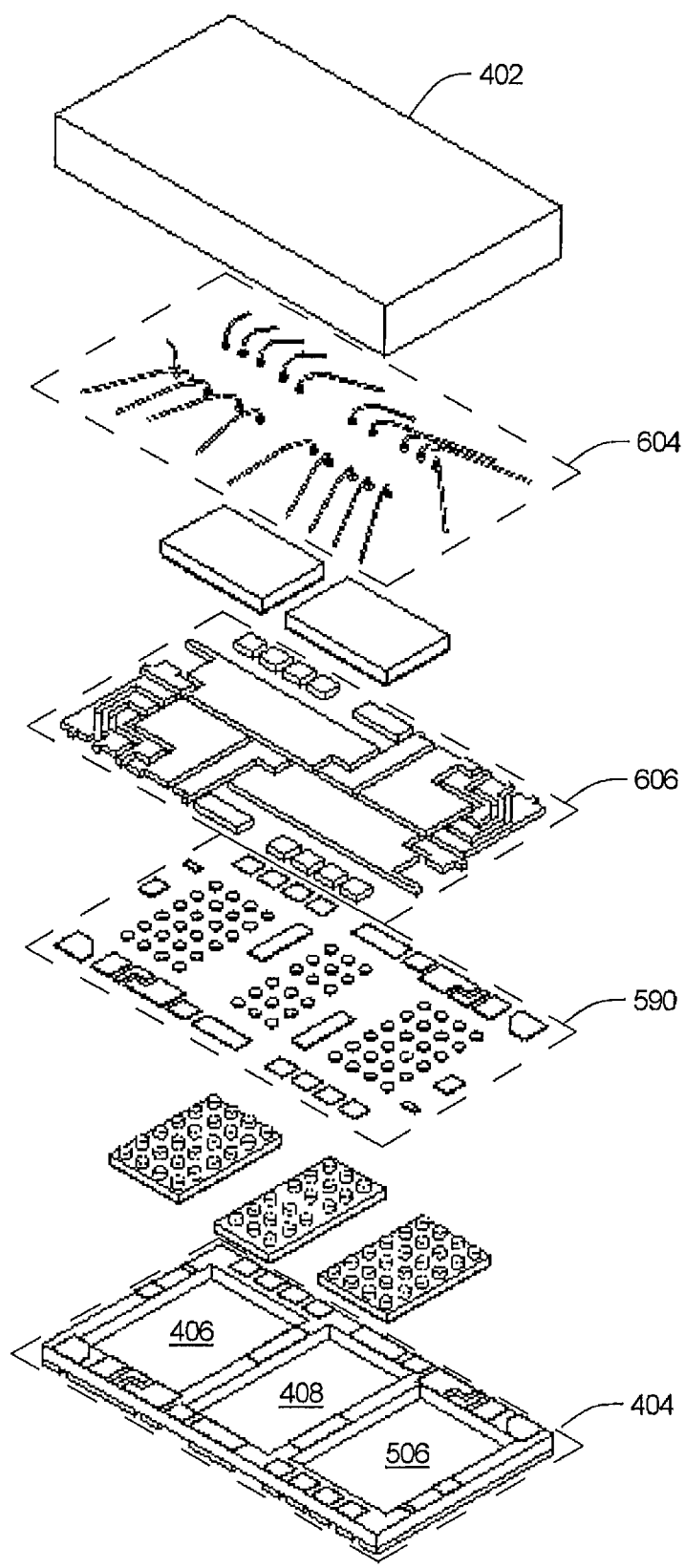
FIG. 7 is an exploded view of the components of the package shown in FIG. 5.
Figure 8:
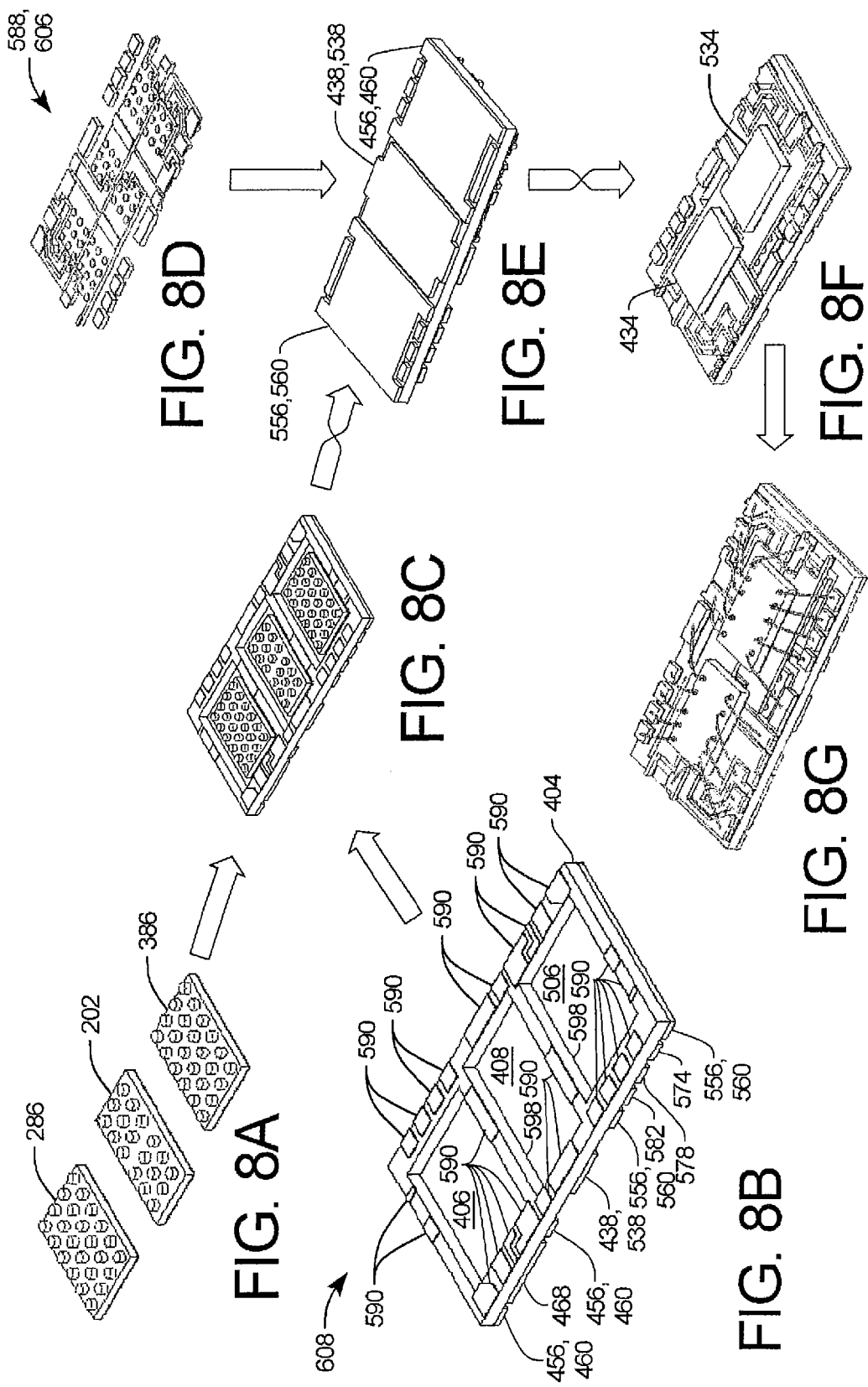
FIGS. 8A-8G are process flow diagrams showing the fabrication steps in forming the package shown in FIG. 5.
Figure 11:
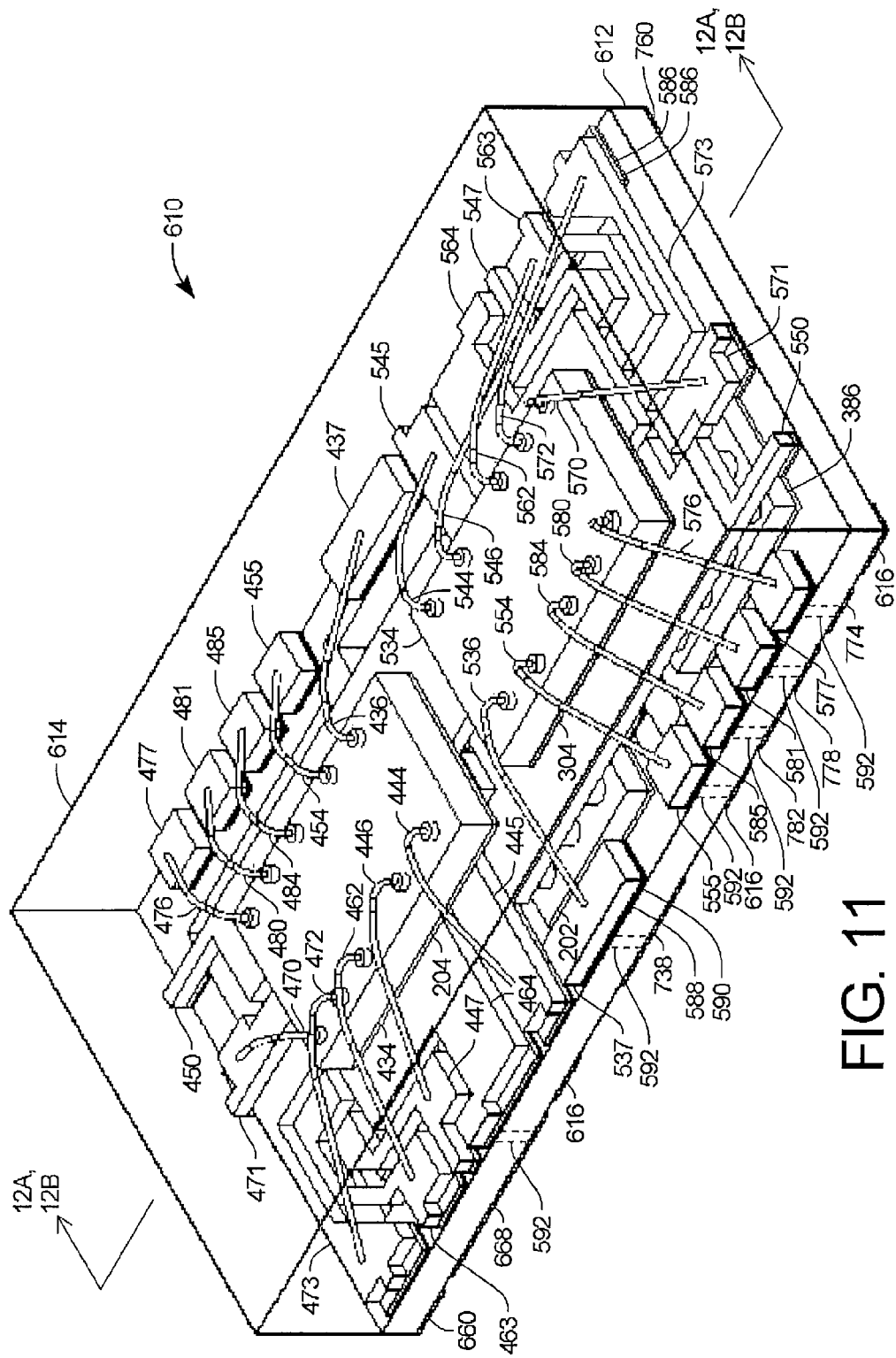
FIG. 11 is a top isometric view of the package shown in FIG. 9 with the encapsulating material shown in outline.
Figure 13:
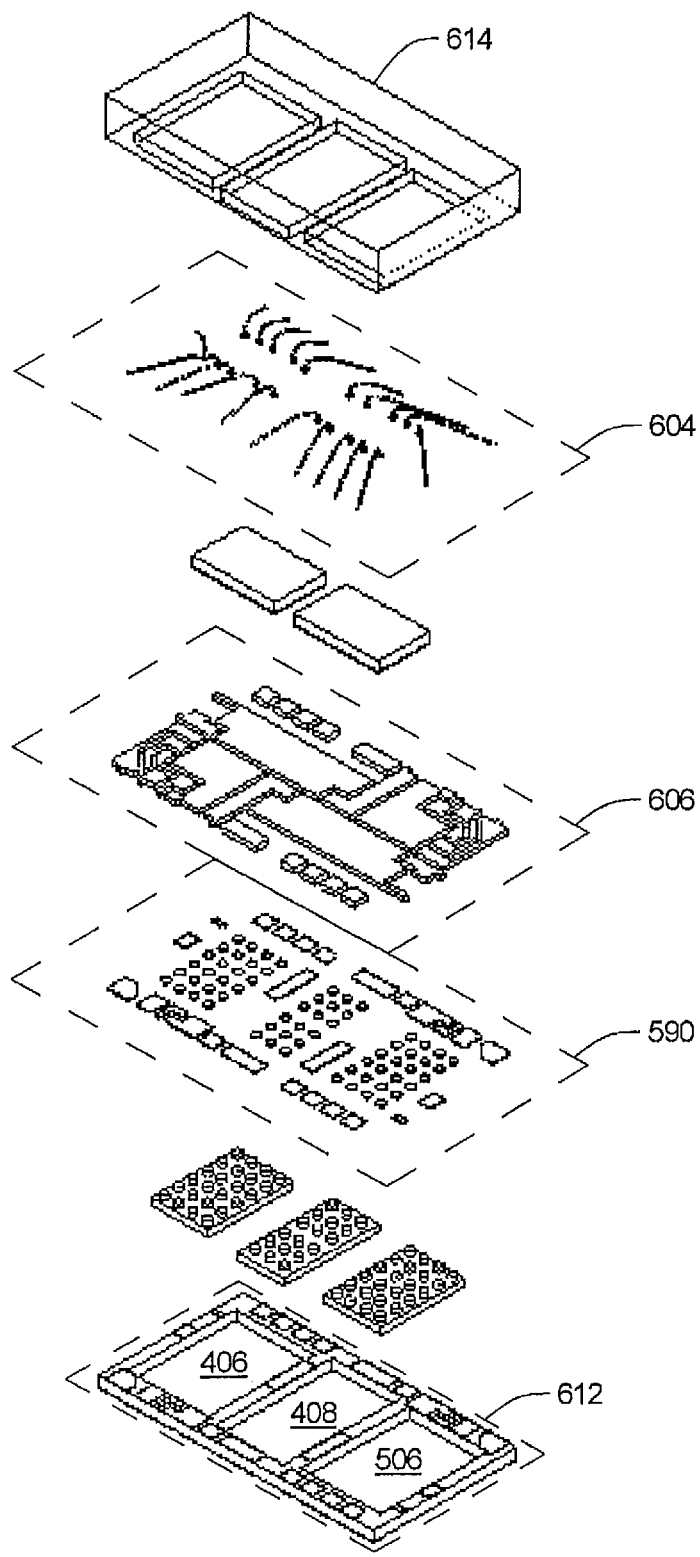
FIG. 13 is an exploded view of the components of the package shown in FIG. 11.
Figure 14A:
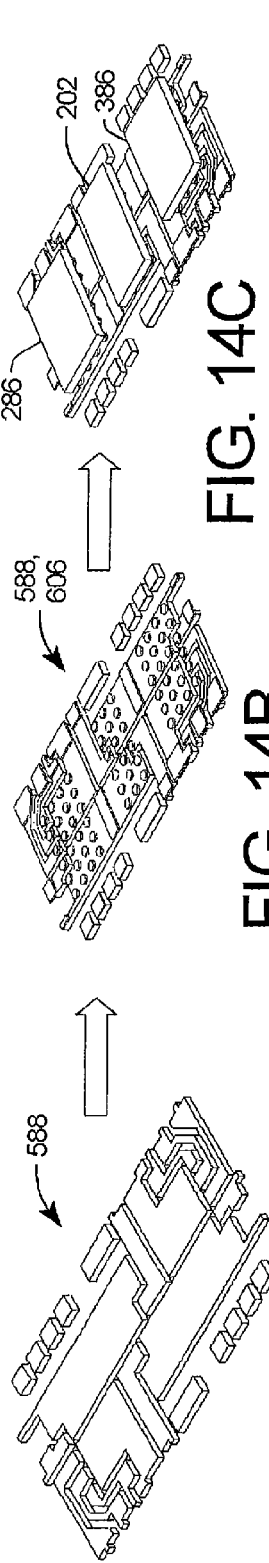
FIGS. 14A-14G are process flow diagrams showing the fabrication steps in forming the package shown in FIG. 1.
Figure 14B:
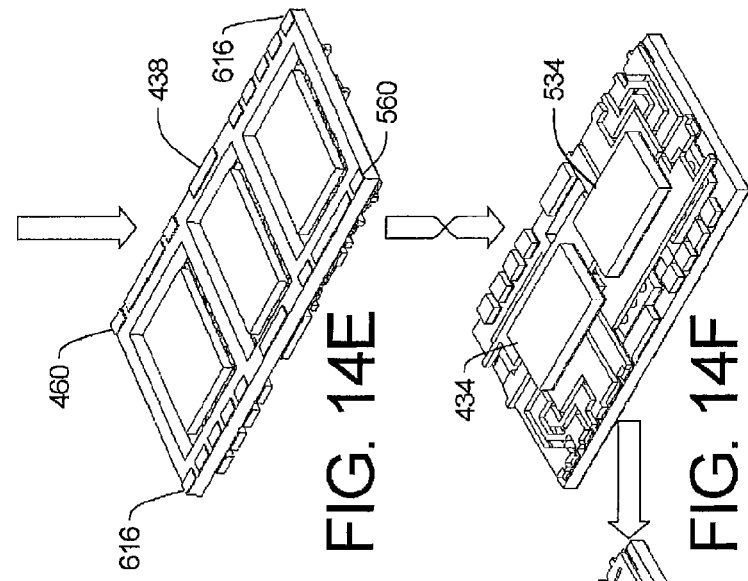
Figure 14C:
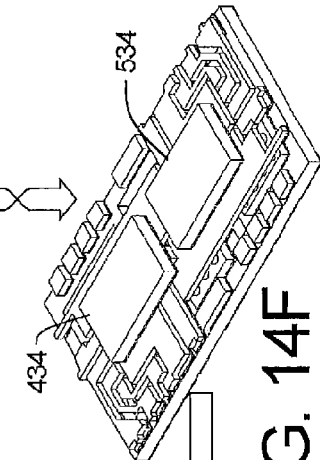
Figure 14E:
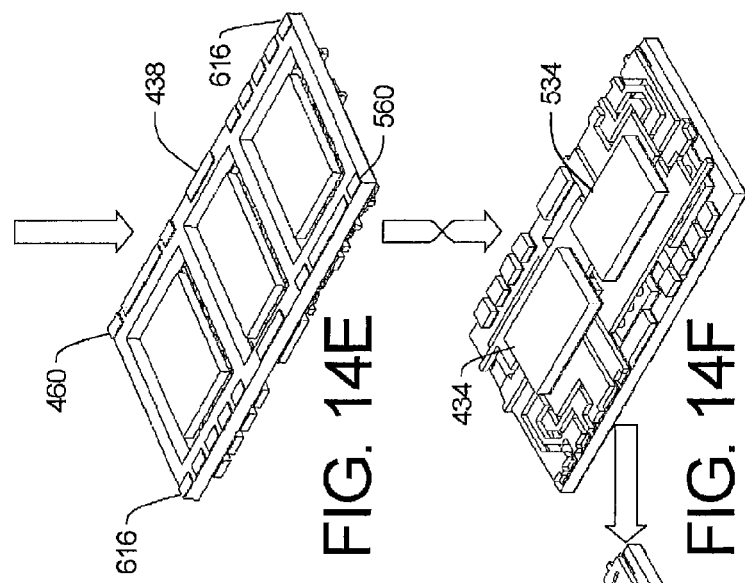
Figure 14F:
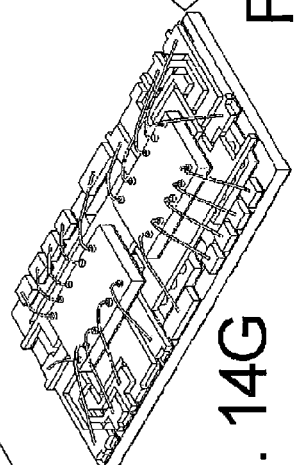
Figure 14D:
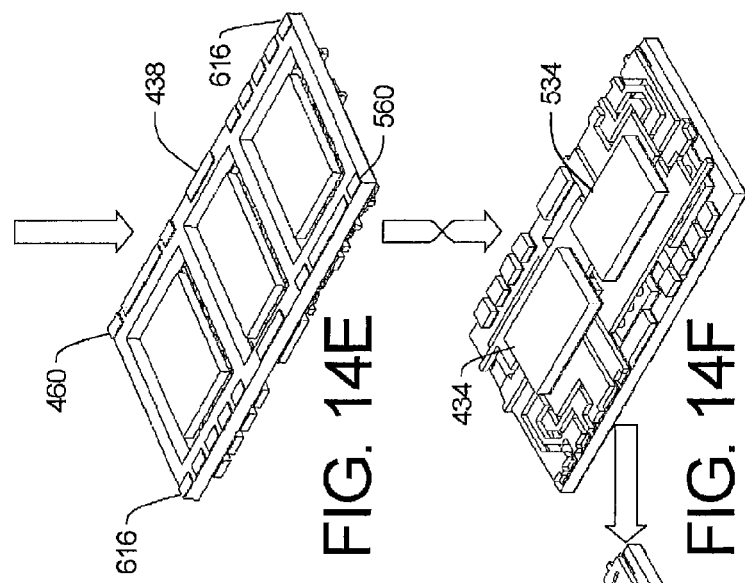
Figure 14G:
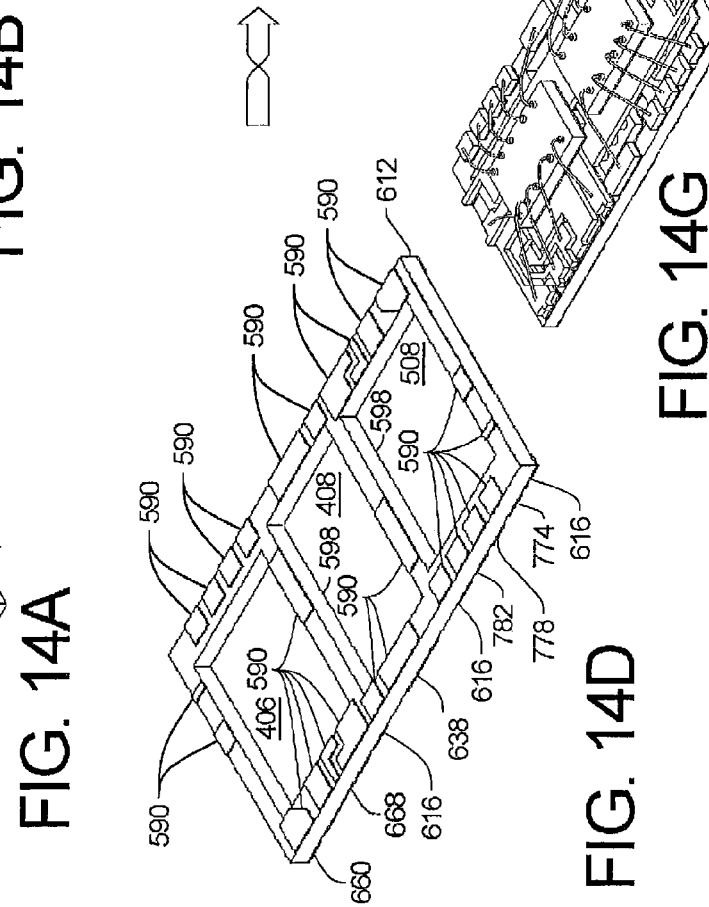

FIGS. 11-13 are the same as FIGS. 5-7 except for the differences described in the previous paragraph.

FIGS. 14A-14F is a diagram of the procedure used to assemble the package 610. The procedure differs from that shown in FIGS. 8A-8G in that the semiconductor chips 286, 202, 386 are flip chip bonded to the leadframe 606 before the leadframe 606 is attached to the PC board 612.

Figure 15:
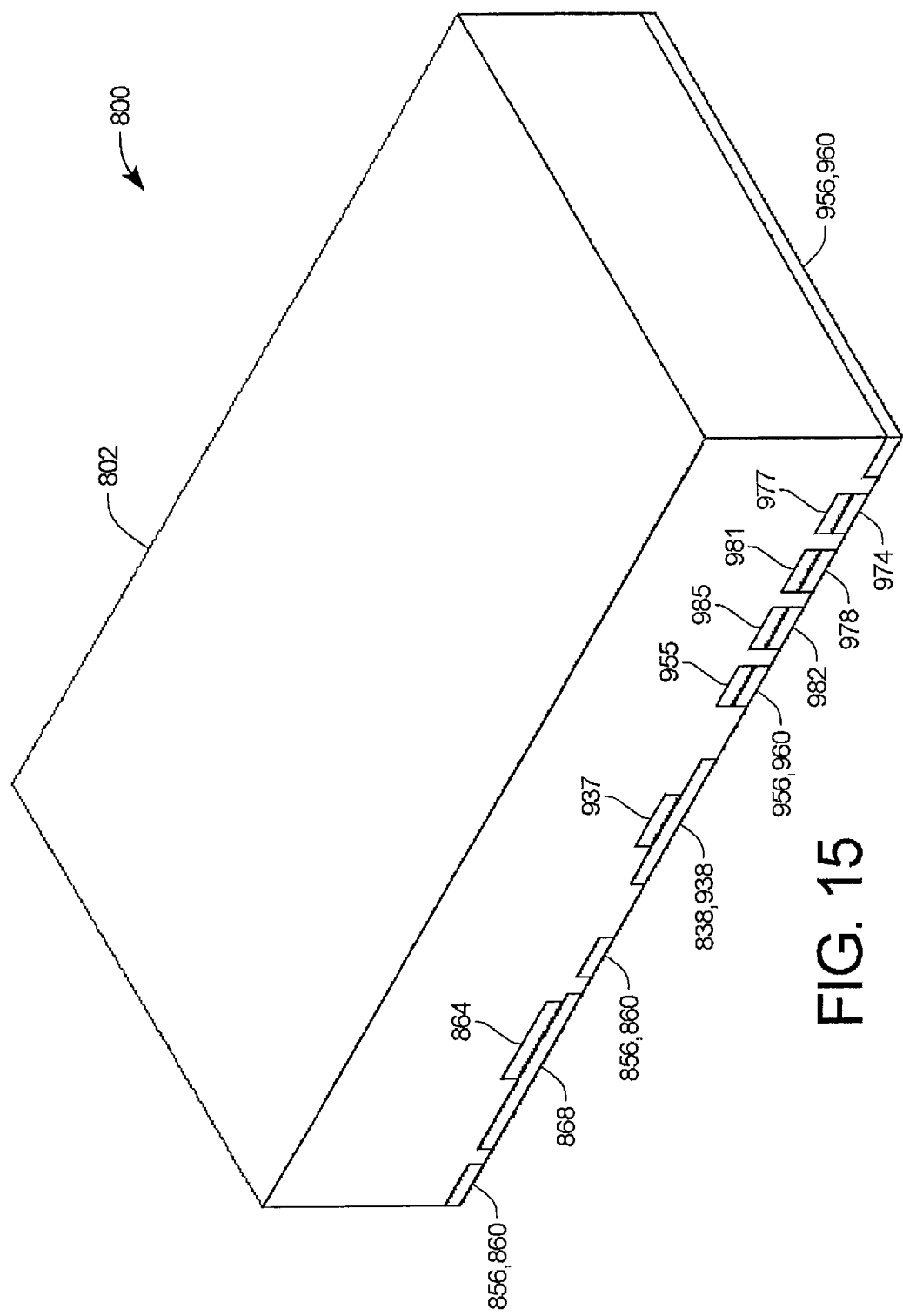
FIGS. 15 and 16 are respective top and bottom perspective views of a semiconductor package with an embedded PCB and stacked die according to a third embodiment of the present invention.
Figure 16:
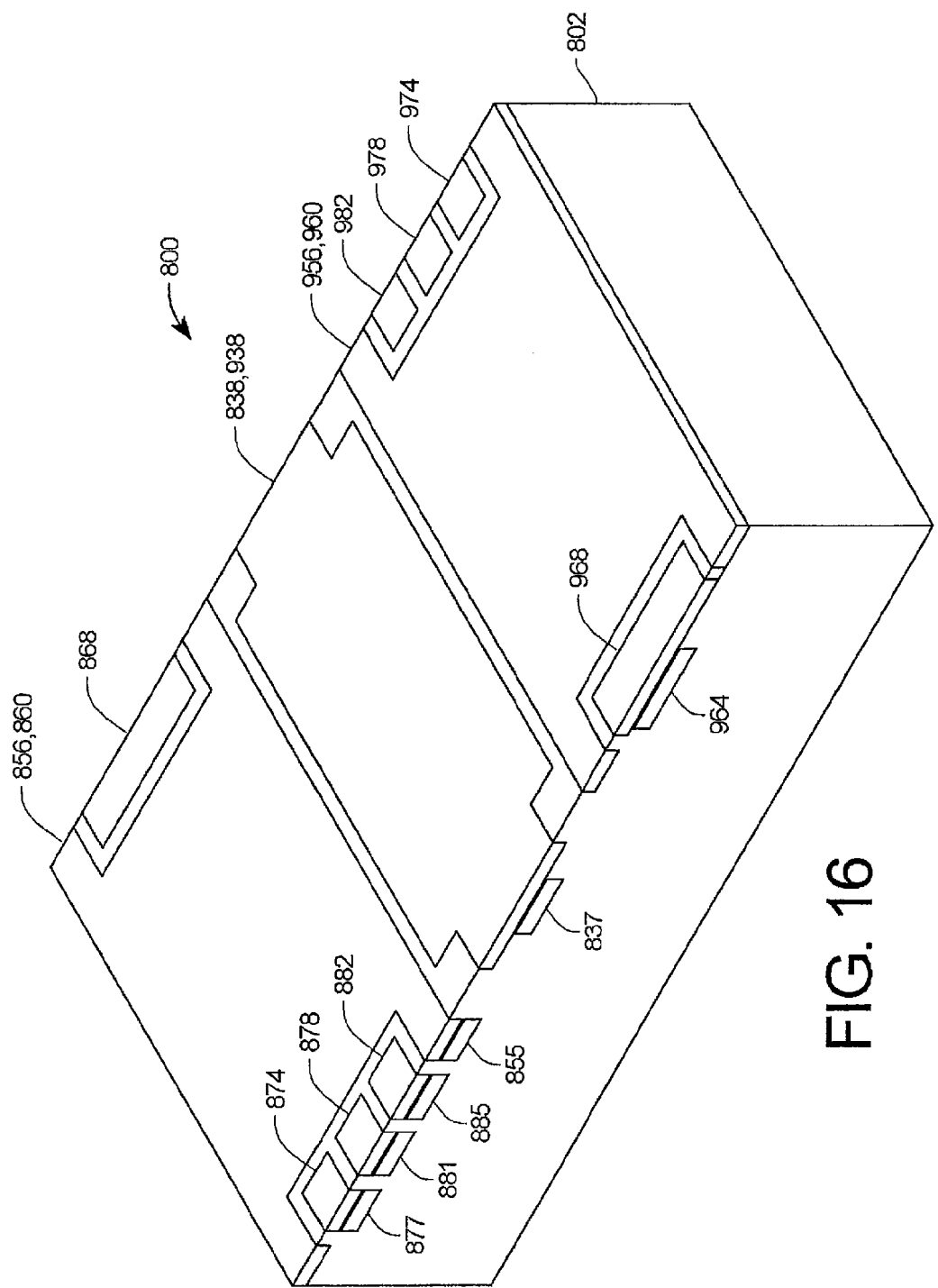
Figure 17:
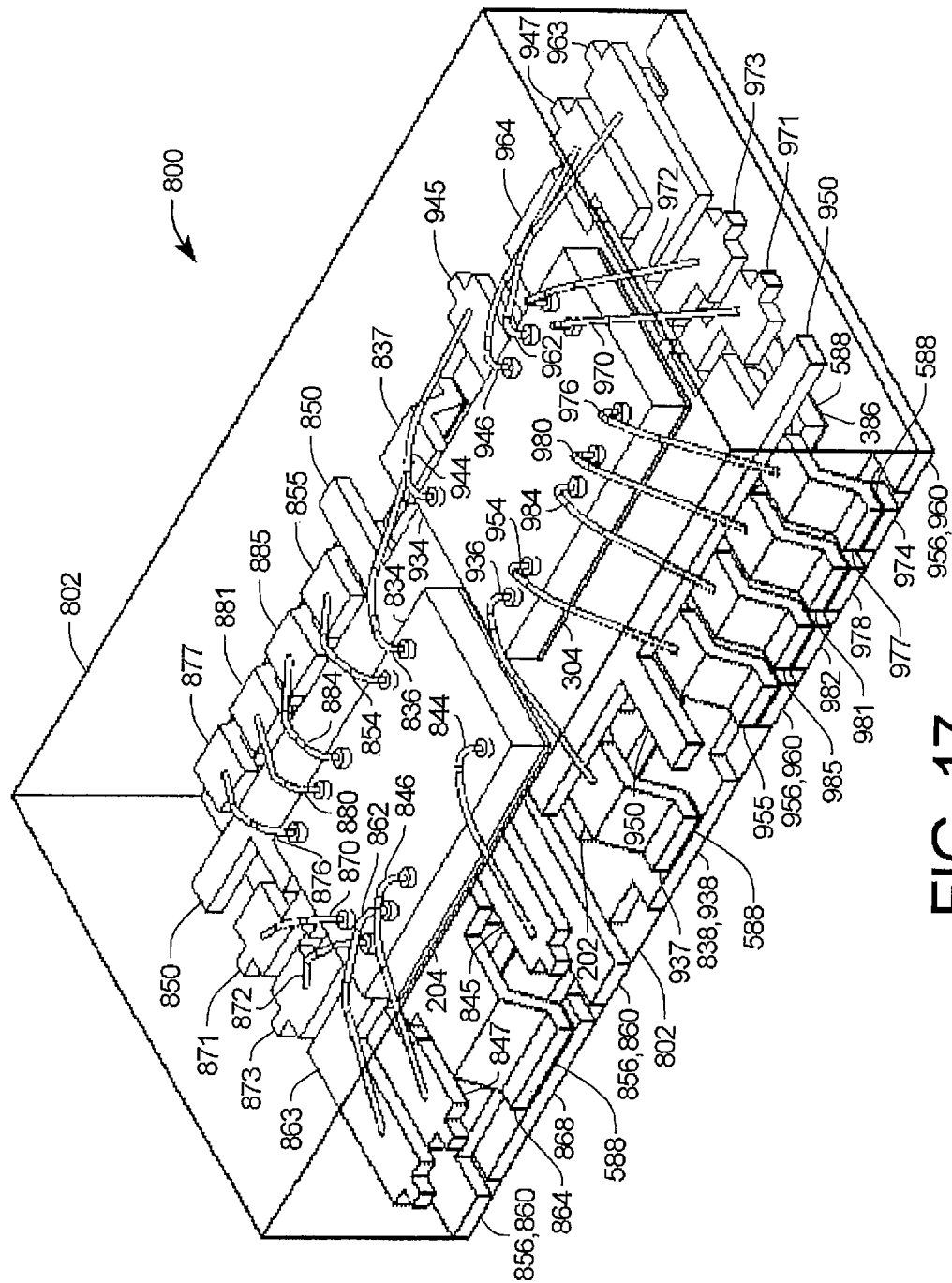
FIG. 17 is a top isometric view of the package shown in FIG. 15 with the encapsulating material shown in outline.
Figure 18:
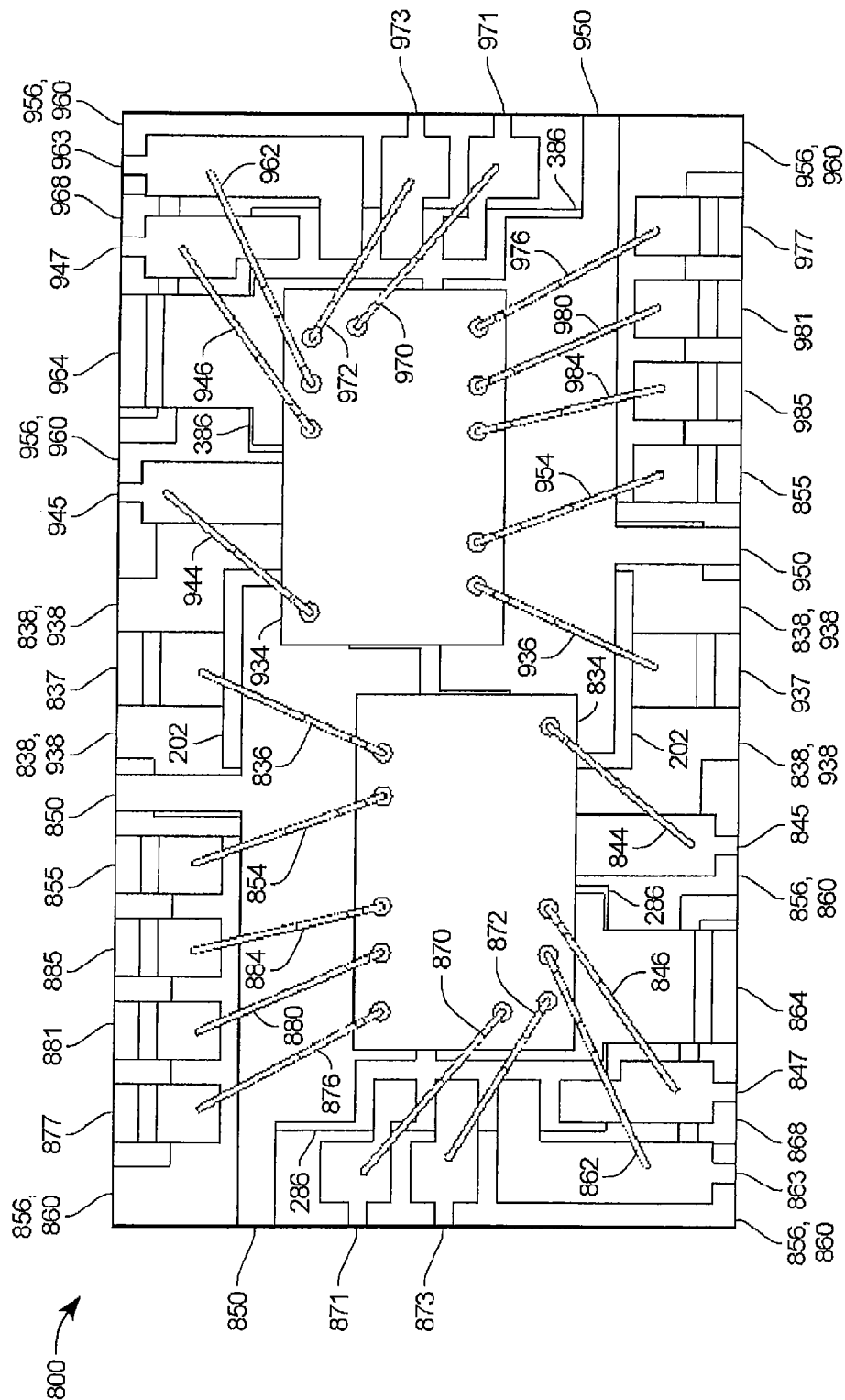
FIG. 18 is a top view of the package shown in FIG. 15 with the encapsulating material shown in outline.
Figure 19A:
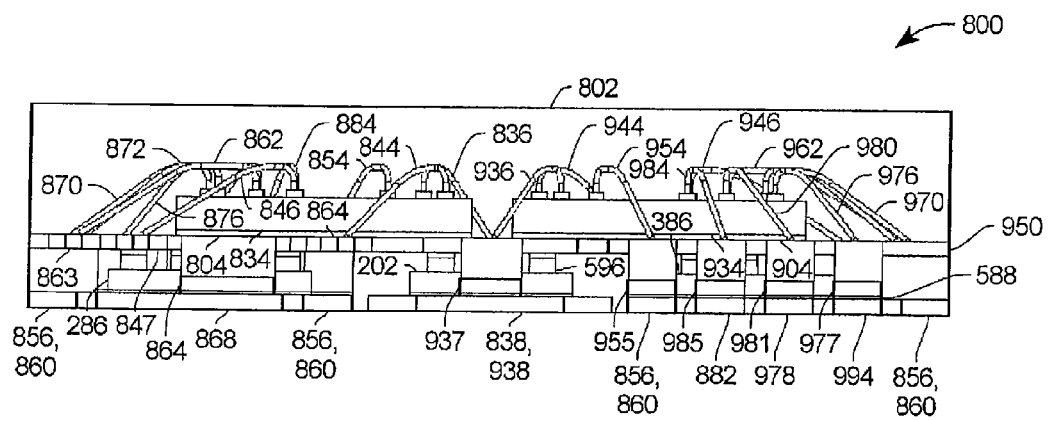
FIG. 19A is a side view of the package shown in FIG. 17.
Figure 19B:
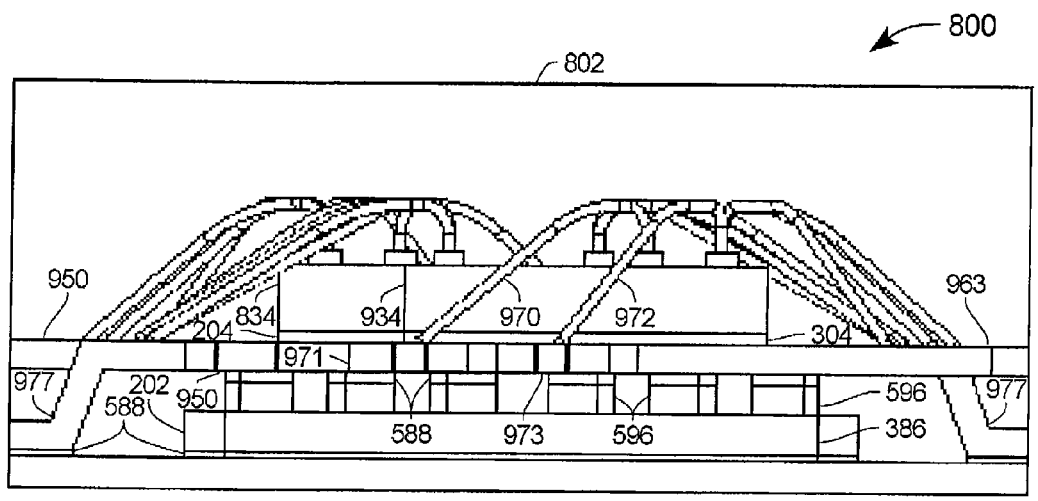
FIG. 19B is an end isometric cross sectional view of the package shown in FIG. 17.

FIGS. 15 and 16 are respective top and bottom isometric views of a power quad flat no-lead (PQFN) package 800 according to a third embodiment of the present invention. Unlike the previous embodiments, the third embodiment does not have a PC board, but rather a lower leadframe 812 (identified in FIG. 20) which corresponds to the lower traces on the PC board 404 shown in FIG. 4. The upper leadframe 806 (identified in FIG. 20) has downward sloping members which are soldered to the lower leadframe rather than using vias through the PC board in the previous embodiments. The package 800 includes molded encapsulating material 802 and exposed edges 864, 937, 955, 985, 981, and 977 of the upper leadframe 806, and exposed edges 856,860, 868, 838,938, 956,960, 982, 978, and 974 of the lower leadframe 812. FIG. 16 shows the lower leadframe 812 which is in three separate larger sections 856,860, 838,938, and 956,960 along with eight smaller sections 874, 878, 882, 868, 968, 982, 978, and 974. Also shown are edges 877, 881, 885, 855, 837, and 964 of the upper leadframe 806.

With reference to FIGS. 17-20, the downward sloping portions of the upper leadframe 806 and the sections of the lower leadframe 812 are soldered together using solder paste 890

Figure 20:
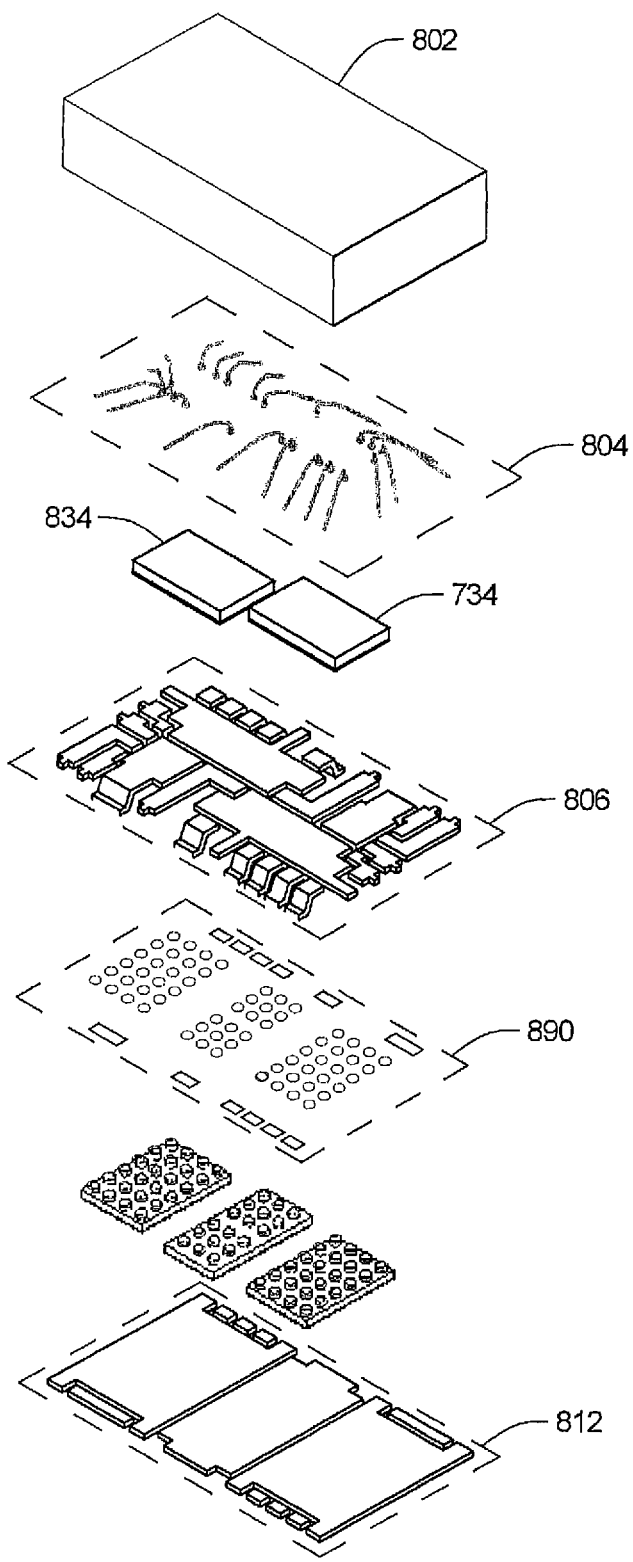
FIG. 20 is an exploded view of the components of the package shown in FIG. 17.

(identified in FIG. 20). The control circuits 834 and 934 are offset with each other rather than in a line as in the first two embodiments. Also, the wire bonding pads are located differently from the first two embodiments, and consequently the wire bonds 804 are different than the wire bonds in the first two embodiments.

FIGS. 21A-21F is a diagram of the procedure used to assemble the package 800. The procedure differs from the first two embodiments in that the control circuits 834, 934 are attached to the upper leadframe 806 as shown in FIG. 21A, and then the wire bonds 804 are attached as shown in FIG. 21B. The semiconductor chips 286, 202, 386 are flipped and placed on the lower leadframe 812 with soft solder (not shown) between the semiconductor chips 286, 202, 386 and the lower leadframe 812 as shown in FIG. 21C. The lower leadframe 812 and the semiconductor chips 286, 202, 386 are heated solder bond the semiconductor chips 286, 202, 386 to the lower leadframe 812 as shown in FIG. 21D. The assemblies of FIGS. 21B and 21D are solder together using the solder paste 890 to form the structure shown in FIG. 21E. Encapsulating material is then formed around the structure of FIG. 21E to form the package 800 shown in FIG. 21F.

Below is a table showing the reference numbers which show corresponding electrical schematic reference numbers in FIG. 1 and their physical structures. Also, some structures in the three embodiments which do not have corresponding elements in FIG. 1 but have corresponding functional structures in the three embodiments.

| FIG. 1 | FIG. 2 | FIGs. 3-8 | FIGs. 9-14 | FIGs. 15-20 |
|---|---|---|---|---|
| 34.134 | 234.334 | 434.534 | 434.534 | 834.934 |
| 36.136 | 236.336 | 436.536 | 436.536 | 836.936 |
| 38.138 | 238.338 | 238.338 | 238.338 | 238.338 |
| 40 | 240 | — | — | — |
| — | — | 437.537 | 437.537 | 837.937 |
| 42.142 | 242.342 | — | — | — |
| 44.144 | 244.344 | 444.544 | 444.544 | 844.944 |
| — | — | 445.545 | 445.545 | 845.945 |
| 46.146 | 246.346 | 446.546 | 446.546 | 846.946 |
| — | — | 447.547 | 447.547 | 847.947 |
| 48.148 | 248.348 | — | — | — |
| — | — | 455.555 | 455.555 | 855.955 |
| 50.150 | 250.350 | 250.350 | 250.350 | 850.950 |
| 54.154 | 254.354 | 454.554 | 454.554 | 854.954 |
| 56.156 | 256.356 | — | — | — |
| 58.158 | 258.358 | — | — | — |
| 60.160 | 260.360 | 460.460 | 660.760 | 860.960 |
| 62.162 | 262.362 | 462.562 | 462.562 | 862.962 |
| — | — | 463.563 | 463.563 | 863.963 |
| 64.164 | 264.364 | 464.564 | 464.564 | 864.964 |
| 68.168 | 268.368 | 468.568 | 668.768 | 868.968 |
| 70.170 | 270.370 | 470.570 | 470.570 | 870.970 |
| — | — | 471.571 | 471.571 | 871.971 |
| 72.172 | 272.372 | 472.572 | 472.572 | 872.972 |
| — | — | 473.573 | 473.573 | 873.973 |
| 74.174 | 274.374 | 474.574 | 674.774 | 874.974 |
| 76.176 | 276.376 | 476.576 | 476.576 | 876.976 |
| — | — | 477.577 | 477.577 | 877.977 |
| 78.178 | 278.378 | 478.578 | 678.778 | 878.978 |
| 80.180 | 280.380 | 480.580 | 480.580 | 880.980 |
| — | — | 481.581 | 481.581 | 881.981 |
| 82.182 | 282.382 | 482.582 | 682.782 | 882.982 |
| 84.184 | 284.384 | 484.584 | 484.584 | 884.984 |
| — | — | 485.585 | 485.585 | 885.985 |

The embodiments shown in FIGS. 3-21 all form a smaller package than results from a more standard layout such as the type shown in FIG. 2.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

The invention claimed is:

1. A semiconductor package comprising:
   a planar leadframe having a first side and an opposite second side, said planar leadframe having a first plurality of conductive traces;
   at least two coplanar dies having first sides bonded to said first side of at least one of said first plurality of conductive traces on said planar leadframe, said at least two dies having second sides comprising a second plurality of solder bumps;
   another leadframe having a third plurality of conductive traces, at least one of said third plurality of conductive traces being attached to at least one die of said two dies on said second side thereof, and another of said third plurality of conductive traces attached to at least one of said first side of at least one of said first plurality of conductive traces on said planar leadframe;
   at least another die bonded to, and electrically insulated from, said another leadframe;
   a third plurality of wire bonds connecting said at least another die with said another leadframe; and
   encapsulating material molded to at least a portion of said planar leadframe, to said two coplanar dies, to said another leadframe, to said another die, and to said third plurality of wire bonds, with at least a fourth plurality of conductive traces on said second side of said planar leadframe being external electrical terminals of said semiconductor package.

2. The semiconductor package set forth in claim 1 wherein said third plurality of conductive traces steps down to connect to said planar leadframe.

3. The semiconductor package set forth in claim 1 wherein at least one die of said two coplanar dies forms an electrical connection between two of said conductive traces of said another leadframe.

4. The semiconductor package set forth in claim 1 wherein said fourth plurality is equal to said first plurality in number.

5. The semiconductor package set forth in claim 1 wherein, said at least another die is vertically stacked above at least a portion of each of said two dies.

6. The semiconductor package set forth in claim 1 wherein at least one die of said two coplanar dies forms an electrical connection between two of said second plurality of conductive pads of said another leadframe.

7. A semiconductor package comprising:
   a planar leadframe having a first side and an opposite second side, said planar leadframe having a first plurality of conductive pads;
   at least two coplanar dies having first sides bonded to at least one of said first plurality of conductive pads on said first side of said planar leadframe, said at least two dies having second sides comprising a plurality of solder bumps;
   another leadframe having a second plurality of conductive pads with corresponding leads, at least one of said second plurality of conductive pads being attached to at least one die of said two dies on said second side thereof, and at least one of said corresponding leads attached to at least one of said first plurality of conductive pads on said first side of said planar leadframe at least another die bonded to, and electrically insulated from, said another leadframe;

a plurality of wire bonds connecting said at least another die with said another leadframe; and encapsulating material molded to at least a portion of said planar leadframe, to said two coplanar dies, to said another leadframe, to said another die, and to said plurality of wire bonds, with a plurality of conductive leads on said second side of said planar leadframe being external electrical terminals of said semiconductor package.

8. The semiconductor package set forth in claim 7 wherein, said at least another die is vertically stacked above at least a portion of each of said two dies.

9. The semiconductor package set forth in claim 7 wherein said corresponding leads step down to connect to said first plurality of conductive pads.

10. The semiconductor package set forth in claim 7 wherein said plurality of conductive leads on said second side of said planar leadframe is equal to said first plurality of conductive pads in number.

* * * * *